(12) United States Patent
Movchan et al.

(10) Patent No.: US 6,669,989 B2
(45) Date of Patent: Dec. 30, 2003

(54) METHOD FOR PRODUCING BY EVAPORATION A FUNCTIONALLY GRADED COATING WITH AN OUTER CERAMIC LAYER ON A METAL SUBSTRATE

(75) Inventors: Boris A. Movchan, Kiev (UA); Leonila M. Nerodenko, Kiev (UA); Jury E. Rudoy, Kiev (UA)

(73) Assignee: International Center for Electron Beam Technologies of E. O. Paton Electric Welding Institute, Kiev (UA)

( * ) Notice: Subject to any disclaimer, the term of this patent is extended or adjusted under 35 U.S.C. 154(b) by 0 days.

(21) Appl. No.: 10/040,518

(22) Filed: Nov. 7, 2001

(65) Prior Publication Data

US 2002/0081447 A1 Jun. 27, 2002

Related U.S. Application Data

(63) Continuation of application No. 09/697,698, filed on Oct. 26, 2000, now abandoned.

(30) Foreign Application Priority Data

Nov. 1, 1999 (UA) .......................................... 99115973

(51) Int. Cl.$^7$ .............................................. C23C 16/00
(52) U.S. Cl. ................. 427/249.5; 427/249.1; 427/249.19; 427/255.15; 427/255.19; 427/255.26; 427/255.28; 427/255.29; 427/255.31; 427/255.32; 427/255.36; 427/255.38; 427/255.391; 427/255.7; 427/294
(58) Field of Search ............................ 427/249.1, 249.5, 427/249.19, 255.15, 255.19, 255.26, 255.28, 255.29, 255.31, 255.32, 255.36, 255.38, 255.391, 255.7, 294

(56) References Cited

U.S. PATENT DOCUMENTS

| | | | |
|---|---|---|---|
| 4,401,697 A | 8/1983 | Strangman | 427/250 |
| 4,676,994 A | 6/1987 | Demaray | 427/42 |
| 4,880,614 A | 11/1989 | Strangman et al. | 428/623 |
| 5,773,078 A | 6/1998 | Skelly | 427/126.3 |
| 5,834,070 A | 11/1998 | Movchan et al. | 427/566 |
| 5,891,267 A | 4/1999 | Schaeffer et al. | 148/206 |
| 6,287,644 B1 * | 9/2001 | Jackson et al. | 427/566 |

FOREIGN PATENT DOCUMENTS

EP          0 814 178 A1    4/1997

* cited by examiner

Primary Examiner—Bernard Pianalto
(74) Attorney, Agent, or Firm—Alix, Yale & Ristas, LLP

(57) ABSTRACT

The invention relates to a method and apparatus for the production of protective coatings on parts. A coating formed in accordance with the invention has a chemical composition and structure gradient across its thickness. The coating is obtained by heating of a composite ingot including a body and at least one insert disposed within the body. As the composite ingot is heated it sequentially evaporates to produce a vapor with a chemical composition varying over the evaporation time period. The composition of the body and composition and location of the insert within the body function to determine the chemical composition of the vapor at any time. Condensation and/or deposition of the vapor onto a substrate forms the inventive coating.

15 Claims, 11 Drawing Sheets

METHOD FOR PRODUCING BY EVAPORATION A FUNCTIONALLY GRADED COATING WITH AN OUTER CERAMIC LAYER ON A METAL SUBSTRATE

This application is a continuing application and claims priority from U.S. patent application Ser. No. 09/697,698 filed on Oct. 26, 2000 abandoned.

BACKGROUND OF THE INVENTION

The invention relates to the production of coatings on a substrate.

More particularly, the invention relates to production of coatings having an outermost ceramic layer and functional and compositional gradients between the outermost ceramic layer and the substrate. The inventive functionally graded coatings provide protection from heat, oxidation, corrosion, erosion and wear of parts such as, for example, gas turbines or internal combustion engines.

Over the last 10 to 15 years improvement of protective coatings has been aimed at creation of coatings having specific discrete gradients or layers of coating composition and coating structure from the substrate to the coating upper layer. Characteristic examples of these coatings can be the thermalbarrier coatings deposited on metal substrates wherein the coating has a discrete, layered variation in composition across the thickness of the coating from the substrate to an outer ceramic layer. Such layered graded coatings are produced in several stages, using various materials (metals, alloys, ceramics) and technological processes for each layer.

U.S. Pat. No. 4,401,697 of Aug. 30, 1983 (T. E. Strangman) describes a three-layered thermal-barrier coating which consists of a bond coat of a oxidation resistant and corrosion resistant alloy of MCrAlY type material of 25–250 $\mu$m thickness, an outer ceramic layer consisting of stabilized $ZrO_2$ with a columnar structure and an interlayer of $Al_2O_3$ of 0.25–2.5 $\mu$m thickness. The MCrAlY alloy comprises, for instance, 18 wt. % Cr, 23 wt. % Co, 12.5 wt. % Al, 0.3 wt. % Y, the remainder being Ni. The MCrAlY alloy bond coat is deposited onto the metal substrate surface by electron beam evaporation of an ingot of MCrAlY alloy. Then the coated surface is subjected to mechanical treatment (for instance, shot peening); the part is annealed and again placed into the vacuum chamber. The outer ceramic coating is produced by electron beam evaporation of a ceramic ingot of stabilized $ZrO_2$ oxide and deposition of the vapor onto the bond coat. A thin interlayer of $Al_2O_3$ is subsequently produced during annealing of the coated substrate in an oxygen-containing atmosphere. This interlayer provides good adhesion on $Al_2O_3/ZrO_2$ interface and slows down the oxidation of MCrAlY surface under high temperature service of the coating.

U.S. Pat. No. 4,676,994 of Jun. 30, 1987 (R. E. Demaray) recommends a four-layer coating which consists of a MCrAlY type alloy bond coat, a thin intermediate layer of $Al_2O_3$ and an outer two-layer coating of stabilized $ZrO_2$. The MCrAlY bond coat of approximately 120 $\mu$m thickness may be produced by electron beam evaporation of a MCrAlY ingot. After appropriate mechanical treatment of the surface (grit blasting), the part is placed into a vacuum furnace at a pressure of approximately $2\times10^{-4}$ mm Hg, heated to 980° C. and soaked for about 10 minutes. This results in formation on the MCrAlY surface of an $Al_2O_3$ containing layer 1.0–2.0 $\mu$m thick. Then a ceramic ingot of $ZrO_2$ is evaporated by the electron beam under a vacuum of $10^{-4}$ mm Hg and a dense ($\approx$94%) layer of $ZrO_2$ approximately 50 $\mu$m thick, is deposited. Subsequently, oxygen is bled into the chamber, and at the pressure of $5\times10^{-1}$ to $1\times10^{-3}$ mm Hg deposition of a less dense upper layer of $ZrO_2$ with a columnar structure approximately 100 $\mu$m thick, is completed. This layer has a lower heat conductivity and satisfactory mechanical relaxation ability.

U.S. Pat. No. 4,880,614 of Nov. 14, 1989 (T. E. Strangman et al) describes a thermal-barrier coating that consists of five layers. The first layer deposited on the substrate comprises diffusion aluminides produced by known processes. The second layer is of an alloy of the MCrAlY type deposited by electron beam evaporation or other methods. The third layer is a thin layer of super pure alpha $Al_2O_3$ produced by chemical vapor deposition (CVD). The fourth layer is a stabilized $ZrO_2$ ceramic layer with a columnar structure, or other ceramics, deposited by electron beam evaporation. The fifth layer, a hard, dense, glazed outer ceramic layer, is produced by laser melting of the edges of the columnar crystallites. The fifth layer is intended to increase erosion resistance. The layer of diffusion aluminides and MCrAlY layer are intended to increase the oxidation and corrosion resistance of thermal-barrier coatings and thus to extend the service life of the coated part.

In European Patent EP 0814178 (D. S. Rickerby) a thermal-barrier coating consisting of seven layers is described. The first layer is a surface of nickel or cobalt base superalloy enriched in a metal of the platinum group, predominantly platinum. It is produced by deposition of a platinum layer 5–8 $\mu$m thick by electroplating and subsequent diffusion annealing in the temperature range of 800 to 1200° C. The second layer, a bond coat is made of an alloy that contains aluminum in the amount of 5–40 wt. %, for instance, MCrAlY type alloys or nickel aluminides or cobalt aluminides. The bond coat is deposited by a vacuum plasma process. The third and fourth layers are an enriched with platinum (or another metal of the platinum group) bond coat and a layer of platinum aluminide (or another aluminide), respectively. These layers are produced by electroplating of platinum or another metal of the platinum group on the bond coat surface and subsequent annealing of the plated substrate in the temperature range of 1000–1200° C. The fifth, sixth and seventh layers are thin layers of gamma phase alumina which is enriched in platinum, a thin layer of pure alumina and an upper ceramic layer of yttrium-stabilized zirconia with a columnar structure, respectively. They are produced using repeated thermal cycles of electron beam evaporation and deposition of ceramic material followed by oxygen bleeding into the vacuum chamber.

U.S. Pat. No. 5,891,267 of Apr. 6, 1999 (J. C. Schaeffer et al) proposes a four-layer coating. The first layer is produced by carbidization of the substrate surface using superalloys which contain carbide forming elements, namely Mo, W, Re, Ta, Ti, Cr, Hf, Zr. Carbidization is performed using conventional furnaces in a mixed atmosphere of hydrogen and methane at lowered pressure and temperature of 900–1200° C. for one to four hours. The first layer, saturated with carbon, has a thickness of up to 100 $\mu$m and contains 25–75 vol. percent carbides. It is followed by a second layer, namely an aluminum-rich bond coat of diffusion aluminum or MCrAlY type alloy produced by known methods. The third, thin layer of $Al_2O_3$ and the fourth ceramic layer of $ZrO_2$-(6–8) wt. % $Y_2O_3$ with a columnar structure are also produced by known methods, typically physical vapor deposition.

A characteristic feature of the above examples, as well as many other patents that have not been cited, is the multistage processing required for production of the layered gradient protective coatings. Typically there is a need to use 2, 3 or more technologically different processes involving different equipment and handling therebetween. Additionally, intermediate treatments of the layer surfaces between stages are required. As a result, known processes for forming layered functionally graded coatings require considerable power consumption, time and expense. Additionally, it is difficult to precisely repeat all of the process parameters for each of the required complex steps in known processes for forming layered functionally graded coatings. Variation of process parameters in any of the stages during the involved multi-step processing results in a low probability of complete repeatability of coating composition and structure; i.e., of coating quality, from part to part. Further, the known coating technologies between the metal and ceramic layers cannot be regarded as optimal in terms of producing flat interfaces. In terms of performance of the ceramic layers, smoothly varying transitions from metal to ceramics are preferable.

Further improvement of the methods of production of multi-layer gradient protective coatings is needed to reduce the number of process stages while also providing simultaneous formation of a continuously varying transition between layers, especially on metal/ceramic interfaces.

The solution closest to the present invention is that described in the U.S. Pat. No. 5,834,070 of Nov. 10, 1998 (B. A. Movchan et al). The '070 patent proposes use of a composite ingot for producing by evaporation a functionally graded coating with an outer ceramic layer on a metal substrate. The composite ingot consists of a ceramic ingot of $ZrO_2(Y_2O_3)$ with a metal ceramic tablet located on the composite ingot upper face. The tablet consists of a mixture of metals and oxides having different vapor pressures at the tablet evaporation temperature. According to the '070 reference, electron beam evaporation of the above ceramic ingot of $ZrO_2(Y_2O_3)$ and metal-ceramic tablet, followed by deposition of the vapor on a substrate, produces a coating with a gradient transition zone between the bond coat surface and outer ceramic layer of $ZrO_2(Y_2O_3)$.

The tablet mixture can be, for instance $Al—Al_2O_3—ZrO_2$ or $Al—Al_2O_3—Pt—ZrO_2$. The vapor pressure of the tablet components at the evaporation temperature is maximal for aluminum and minimal for zirconium oxide; i.e., it decreases in the following sequence:

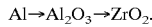

$Al \rightarrow Al_2O_3 \rightarrow ZrO_2$.

Therefore as the composite ingot is heated, aluminum is the first material to evaporate, later accompanied by evaporation of aluminum oxide. At the final stage of heating the zirconium oxide of the tablet evaporates with an uninterrupted transition to evaporation of the zirconium oxide of the ingot. As a result, a gradient transition zone (bond coat) 3–5 μm thick forms between the substrate surface and the outer ceramic coating of $ZrO_2(Y_2O_3)$ during vapor condensation onto the substrate. The gradient transition zone consists of individual microlayers, for instance NiAl, $Al_2O_3$, or $Al_2O_3—ZrO_2$. It should be noted that condensation of the tablet vapor flow proceeds, as a rule, onto the substrate surface that has been preheated to temperatures above the aluminum melting point (660° C.). Therefore, the first portions of aluminum to condense on the substrate surface are in the form of a very thin layer of liquid which interacts with the material of the substrate surface or previously applied MCrAlY bond coat, and provides a strong bond between the substrate and the gradient transition zone. As was noted above, the "metal ceramic tablet/ceramic ingot" composition allows limited formation of a gradient transition zone (bond coat) between the metal substrate and the outer ceramic coating. The composition and structure of this gradient transition zone is dependent on the tablet metal-ceramic mixture that is fractionally evaporated by electron beam heating. The requirement for fractional evaporation of tablet metal-ceramic mixtures imposes considerable limitations on the resulting coating composition and structure, as well as on the thickness of the gradient transition zone. Moreover, the above approach does not permit creation of many of the desired gradients of composition or structure, either of the metal bond coat or of the upper ceramic layer.

SUMMARY OF THE INVENTION

An object of the invention is to provide a composite ingot for use in formation of a functionally graded coating on a substrate.

Another object of the invention is to provide a composite ingot for use with a single stage coating process to form a functionally graded coating on a substrate.

Yet another object of the invention is to provide a composite ingot that can be continuously and sequentially evaporated and the vapors condensed on a substrate to form a functionally graded coating on a substrate.

A further object of the invention is to provide a single stage coating process for formation of a multilayer coating on a substrate.

A still further object of the invention is to provide a single stage coating process of improved precision and repeatability for formation of a coating having a desired gradient composition and gradient structure on a substrate.

Other objects and advantages of the invention will become apparent from the drawings and the specification.

One aspect of the invention comprises a composite ingot that can be evaporated and the vapors condensed on a substrate to form a functionally gradient coating with an outer ceramic layer on the metal substrate. The composite ingot comprises a ceramic body that preferably has a predominately cylindrical shape. At least one, and more preferably multiple, inserts are partially or fully disposed within the upper, middle and/or lower parts of the body. The inserts are comprised of metallic materials, nonmetallic materials or mixtures thereof. The selection and appropriate arrangement of the ceramic body and the inserts provides for formation of a gradient multilayer coating having a desired composition and structure when the composite ingot is evaporated and the vapors deposited on a substrate. It is preferable for the above inserts to have the shape of tablets or bars with a cylindrical, conical or more complex-shaped surface.

Another aspect of the invention is a single stage coating formation process wherein a composite ingot is continuously evaporated and the vapors condensed on a substrate to form a functionally gradient coating with an outer ceramic layer on the metal substrate. Preferably the composite ingot is heated from a first surface to a second surface via a concentrated energy source, for example an electron beam. The evaporation of the ingot is preferably substantially continuous from the first surface to the second surface. As the temperature of the heated surface increases materials evaporate from the heated surface and the vapors condense and deposit onto an adjacent substrate surface. As the composite ingot evaporates, different portions of the composite ingot are exposed to the electron beam and in turn begin to evaporate. The different composite ingot portions have different compositions depending on the material of the ingot body and location and material of the inserts within the body. The differing ingot compositions when evaporated provide varying vapor compositions. The varying vapor compositions deposit on the substrate surface to form a gradient multilayer coating having a desired composition and structure.

Preferably, the inserts located partially or fully within the upper part of the composite ingot (the first part of the composite ingot to be heated) are made of materials which have a melting temperature lower than, and a vapor pressure higher than, the melting temperature and vapor pressure of the ceramic body of the ingot. In this way these inserts are the first to evaporate on heating of the composite ingot, and their vapors preferentially condense on the substrate to form a transition bond coat or layer of the desired composition and structure. One should emphasize the positive influence of the low melting metals and alloys present in the inserts, whose melting temperature is preferably lower than the preheated temperature of the substrate prior to coating deposition. In this situation a thin molten film is created on the substrate surface at the initial moment of insert vapor condensation. The molten film dissolves the substrate surface microroughness, interacts with the substrate material and promotes the formation of a dense structure of the substrate bond coat contact zone.

Preferably, the materials of the inserts located in the upper part of the ceramic base are selected depending on their coating purpose. The inserts may comprise metals, alloys, intermetallics, silicides, metal ceramics, or organic substances so that in heating of the composite ingot, the material of the inserts is the first to evaporate and the first to condense on the substrate, forming a transition bond coat layer (or layers) of the desired structure and composition on the substrate. It is this ability to select materials which functions to provide the desired structure and composition of the transition bond coats on the substrate.

It is preferred for the inserts located in the middle and lower part of the ceramic body (the middle and last parts of the composite ingot to be heated respectively) to be made predominantly from a nonmetallic material. In this manner the material of the inserts evaporates and condenses simultaneously with the ceramic material of the body, providing the desired composition and structure for the middle and outer ceramic layers of the gradient coating.

One embodiment is especially suited to produce a thermal-barrier functionally graded coating with an outer ceramic layer on a metal substrate using a single stage coating process. In this embodiment the ceramic body of the composite ingot is comprised of a partially or completely stabilized $ZrO_2$ and contains inserts which are located in the upper, middle, and lower parts of the composite ingot. The ceramic body is comprised of $ZrO_2$, which has a low thermal conductivity and provides the thermal-barrier properties of the resulting gradient coating. The inserts are comprised of metallic or nonmetallic materials having shapes and dimensions suitable for formation of the desired coating. The inserts in the composite ingot function to ensure formation of a desired gradient multilayer coating of the specified composition and structure during a continuous single-stage evaporation of the composite ingot and condensation of the evaporated vapors onto the substrate. It is preferred that in this embodiment the inserts have the shape of tablets or bars with a cylindrical, conical or more complex-shaped surface.

It is preferable that when the ingot body comprises $ZrO_2$, the inserts located in the upper part of the composite ingot are made of a material comprising Al, Si, Fe, Ni, Co, Cr, Mn, Y, Pt, Zr, Hf, AlCr alloys, $M_1Cr$ and $M_1CrAlY$ type alloys (where $M_1$=Fe, Ni, Co), nickel aluminides, cobalt aluminides, platinum aluminides, and their alloys, chromium silicides, carbon-containing organic compounds, $Al_2O_3$, $Cr_2O_3$, $La_2O_3$, $CeO_2$, $B_2O_3$, MgO, metal-ceramic mixtures of $M_2$—Y—$ZrO_2$, $M_2$—Y—Pt—$ZrO_2$, $M_2$—Y—$Al_2O_3$—$ZrO_2$ type (where $M_2$=Al, Cr), $Al_2O_3$, $Cr_2O_3$, $Y_2O_3$, $ZrO_2$ and mixtures of any of the above. These materials and combinations function to promote the formation of a desired structure of the substrate bond coat contact zone and provide high adhesion to the overlying $ZrO_2$ thermal barrier coating.

It is preferable in this embodiment that the inserts located in the middle and lower part of the composite ingot to be made of a material comprising $Al_2O_3$, $Y_2O_3$, $La_2O_3$, $B_2O_3$, $CeO_2$, $HfO_2$, MgO, CaO, $SiO_2$ and mixtures thereof. These materials and combinations function to allow a smooth transition zone to be formed between the metal bond coat layer (or layers) and the overlying ceramic layer (or layers) of the $ZrO_2$ based gradient coating.

A second embodiment of the invention is especially suited to produce high temperature and erosion resistant functionally graded coatings with an outer ceramic layer on a metal substrate using a single stage process of coating deposition. In this embodiment the ceramic body of the ingot is made from $Al_2O_3$ and contains inserts which are located in the upper, middle and lower parts of the body. The inserts are made of metallic or non-metallic materials and have the shapes and dimensions suitable for formation of the desired coatings as described below. This embodiment provides for production of not only high temperature and erosion-resistant, but also hard and wear resistant $Al_2O_3$ based coatings. It is preferred that in this embodiment the above inserts have the form of tablets or bars with a cylindrical, conical or more complex-shaped surface.

It is preferable that when the ingot body is made of $Al_2O_3$, the inserts located in the upper part of the body are made from a material comprising Sn, Al, Cu, Fe, Ni, Co, Cr, Y, $M_3Cr$ and $M_3CrAlY$ alloys (where $M_3$=Sn, Cu, Fe, Ni, Co), iron, nickel and cobalt intermetallics, chromium silicides, carbon-containing organic compounds, $M_4$—$Al_2O_3$, $M_4$—Ni—$Al_2O_3$ (where $M_4$=Sn, Al, Cr, Y, Fe, Cu), Sn—Cr—$Al_2O_3$ metal ceramic mixtures and mixtures of any of the above. These materials and combinations function to provide the desired structure of the substrate bond coat contact zone and provide high adhesion of the high temperature and erosion resistant functionally graded $Al_2O_3$ based coatings.

It is preferable for the inserts located in the middle and lower part of the composite ingot to be made of a material comprising $Cr_2O_3$, MgO, $SiO_2$, $ZrO_2$, $Y_2O_3$, $B_2O_3$ and mixtures thereof. These materials and combinations function to allow a smooth transition zone to be formed between the metal bond coat layer (or layers) and the overlying ceramic layers of the $Al_2O_3$ based gradient coating.

Another aspect of the invention is a composite ingot and process to produce a desired hard and wear-resistant functionally graded coatings with an outer ceramic layer on a metal substrate by a single stage coating process. A third embodiment of the invention is especially suited to produce a functionally graded coating with an outer ceramic layer on a metal substrate using a single stage deposition process. In this embodiment the ceramic body of the ingot is made from TiC and contains inserts which are located in the upper, middle and lower parts of the body. The inserts are made of metallic or non-metallic materials having shapes and dimensions suitable for formation of the desired coating as described below. The inserts in the composite ingot function to ensure formation of a desired gradient multilayer coating of the specified composition and structure during a continuous single-stage evaporation of the composite ingot and condensation of the evaporated vapors onto the substrate. It is preferred that in this embodiment the inserts have the form of tablets or bars with a cylindrical, conical or more complex shaped surface body. It is preferable that when the ceramic body of the ingot is made of TiC, the inserts located in the upper part of the composite body are made from a material comprising Sn, Al, Cu, Fe, Ni, Co, Cr, $M_5$Cr, $M_5$CrAl alloys (where $M_5$=Sn, Cu, Fe, Ni, Co), NiCo, carbon containing organic compounds, Co—TiC; Ni—TiC, Cr—Co—TiC, Cr—Ni—TiC, Sn—Cr—Ni(Co)—TiC, Sn—Cr—Ti—TiC and mixtures of any of the above. These materials and combinations function to promote the formation of a desired structure of the substrate bond coat contact zone and provide high adhesion of the overlying high-temperature and erosion resistant functionally graded TiC base coatings.

It is preferable in this embodiment for the inserts located in the middle and lower part of the composite ingot to be made of a material comprising ZrC, HfC, $Cr_3C_2$, $TiB_2$ and mixtures thereof. These materials and combinations function to allow a smooth transition zone to be formed between the metal bond coat layer (or layers) and the overlying ceramic layer (or layers) of the gradient TiC base coating.

A fourth embodiment of the invention is especially suited for production of hard and wear-resistant functionally graded coatings with an outer ceramic layer on a metal substrate using a single stage process. In this embodiment the ceramic body of the ingot is made of $TiB_2$ and contains inserts which are located in the upper, middle and lower parts of the composite ingot. The inserts in the composite ingot function to ensure formation of a desired gradient multilayer coating of the specified composition and structure during a continuous single-stage evaporation of the composite ingot and condensation of the evaporated vapors onto the substrate. The inserts are made of metallic or non-metallic materials having shapes and dimensions suitable for formation of the desired coating as described below. It is preferred that in this embodiment the inserts have the form of tablets or bars with a cylindrical, conical or more complex-shaped surface.

It is preferable that when the ingot body comprises $TiB_2$, the inserts located in the upper part of the composite ingot are made from a material comprising Sn, Al, Cu, Fe, Ni, Co, Cr, $M_6$Cr type alloys (where $M_6$=Sn, Cu, Fe, Ni, Co), cobalt silicides, carbon-containing organic compounds, Cr—$TiB_2$ Sn—Ti—$TiB_2$, Sn—Cr—$TiB_2$, Sn—Ti—$TiB_2$ and mixtures of any of the above. These materials and combinations function to provide the desired structure of the substrate bond coat contact zone and provide high adhesion of the high temperature and erosion-resistant functionally graded $TiB_2$ based coatings.

It is preferable in this embodiment for the inserts located in the middle and lower part of the composite ingot to be made of a material comprising $ZrB_2$, TiC, ZrC, HfC and mixtures thereof. These materials and combinations allow a smooth transition zone to be formed between the metal bond coat layer (or layers) and the overlying ceramic layer (or layers) of this gradient $TiB_2$ based coating.

In any embodiment, formation of a complex multi-phase ceramic coating outer layer is achieved by placing in the ingot lower portion a tablet comprised of non-metallic materials with a broad range of melting temperatures and vapor pressures. The tablet is the last to evaporate and completes the formation of the gradient coating. In particular, the tablet composition and process condensation conditions determine the degree of coating surface roughness.

The composite ingot is produced by traditional metallurgical methods, primarily powder metallurgy methods. These production methods allow precise control over the shapes and composition of the ceramic body and the shapes, compositions and locations of the inserts within the body. The preferred single stage coating deposition process wherein the composite ingot is sequentially evaporated from a first side to an opposing side produces a vapor having varying chemical compositions over the time period of the evaporation. Deposition of the vapor onto the substrate is continuous with evaporation so that a coating having a desired gradient composition and gradient structure from the substrate to the coating outer surface can be produced. The precision and repeatability of both the composite ingot and the preferred single stage evaporation-deposition process provide a high level of repeatability of the composition, structure and properties of the resulting functionally graded coatings.

BRIEF DESCRIPTION OF THE DRAWINGS

Other objects and advantages of the invention will be evident to one of ordinary skill in the art from the following detailed description may with reference to the accompanying drawings, in which:

FIG. 2b is a cross-sectional distribution of selected coating elements of the gradient thermal barrier coating produced by a deposition process using the composite ingot of FIG. 2a;

FIG. 3b is a cross-sectional distribution of selected coating elements of the gradient thermal-barrier coating produced by a deposition process using the composite ingot of FIG. 3a;

FIG. 4b is cross-sectional distribution of selected coating elements of the gradient thermal-barrier coating produced by a deposition process using the composite ingot of FIG. 4a;

FIG. 5b is a cross-sectional distribution of selected coating elements of the gradient thermal-barrier coating produced by a deposition process using the composite ingot of FIG. 5a;

FIG. 6b is a cross-sectional distribution of selected coating elements of the gradient thermal-barrier coating after vacuum annealing of the coated substrate at 1050° C. for two hours produced by a deposition process using the composite ingot of FIG. 6a;

FIG. 7b is a cross-sectional distribution of selected coating elements of the gradient thermal-barrier coating produced by a deposition process using the composite ingot of FIG. 7a;

FIG. 8b is a cross-sectional distribution of selected coating elements of the gradient thermal-barrier coating produced by a deposition process using the composite ingot of FIG. 8a;

FIG. 9a is a schematic illustration of a composite ingot having a body comprising $Al_2O_3$, and upper insert comprising 48Sn—52Cr and a lower insert comprising MgO;

FIG. 9b is a cross-sectional distribution of selected coating elements of the protective coating produced by a deposition process using the composite ingot of FIG. 9a;

FIG. 10a is a schematic illustration of a composite ingot having a body comprising TiC, an upper insert comprising 10 Al-90Co and a lower insert comprising $TiB_2$;

FIG. 10b is a cross-sectional distribution of selected coating elements of the coating produced by a deposition process using the composite ingot of FIG. 10a.

DETAILED DESCRIPTION OF THE INVENTION

With reference to the drawings, wherein like numerals designate like components throughout the Figures, a composite ingot is generally designated 10. The composite ingot 10 is typically in the form of a cylinder, although other shapes such as, for example, polygons, are believed to be useful in the practice of the invention. It should be noted that with reference to FIG. 1 the upper surface is the first surface to be evaporated and the lower surface is the last surface to be evaporated.

The composite ingot comprises a body 12 typically formed of various refractory materials such as, for example, $ZrO_2$, $Al_2O_3$, TiC, $TIB_2$ depending on the desired properties of the resulting coating.

Inserts 14–24 are disposed within the composite ingot body 12. The inserts may be, for example, disposed within cavities in the body or formed integrally with the body. The inserts are comprised any of a number of materials and combinations thereof directed toward formation of a desired coating as further explained below. Inserts 14, 16 and 18 are located in the upper part of ingot 10. Inserts 20a–c and 22 are located in the middle and lower part of ingot 10. Insert 24 is located in the lower part of ingot 10. The shapes of the inserts and location of the inserts in the body may be varied to achieve desired coating structure and composition.

Figure 1:
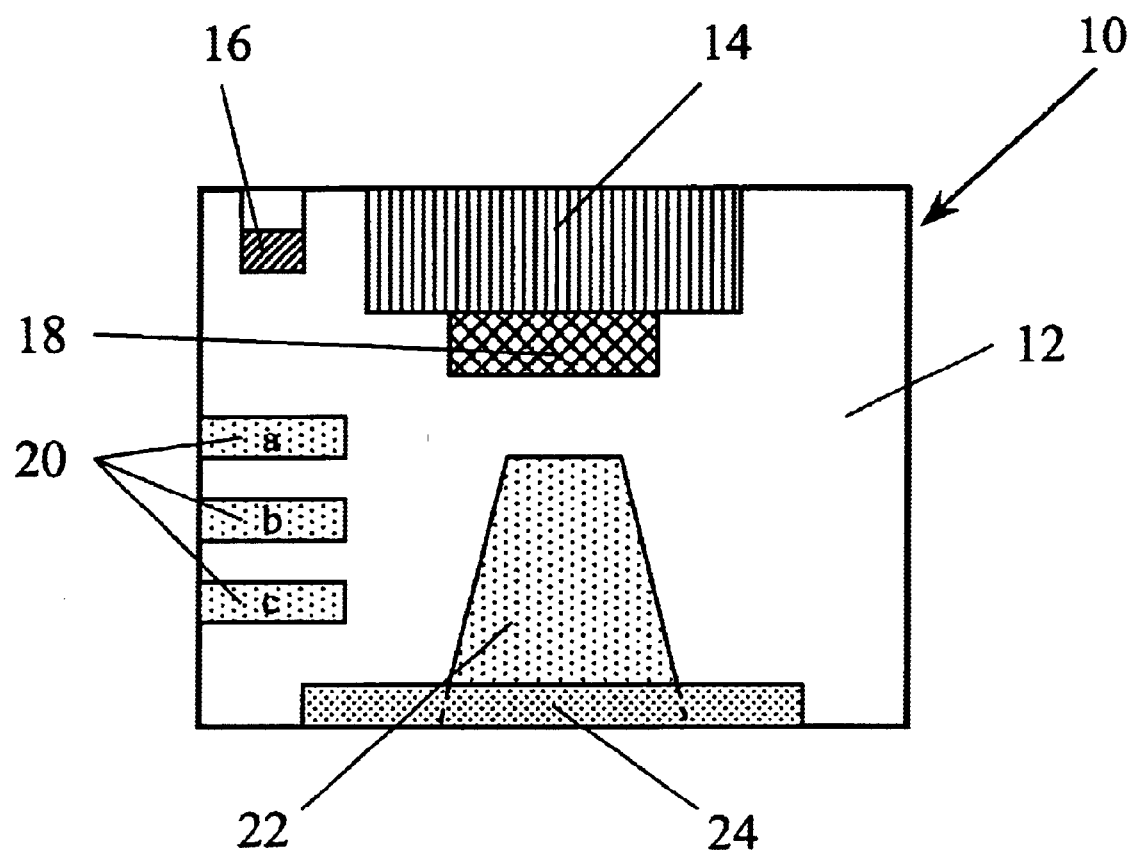
FIG. 1 is a schematic illustration of a composite ingot.
Figure 11:
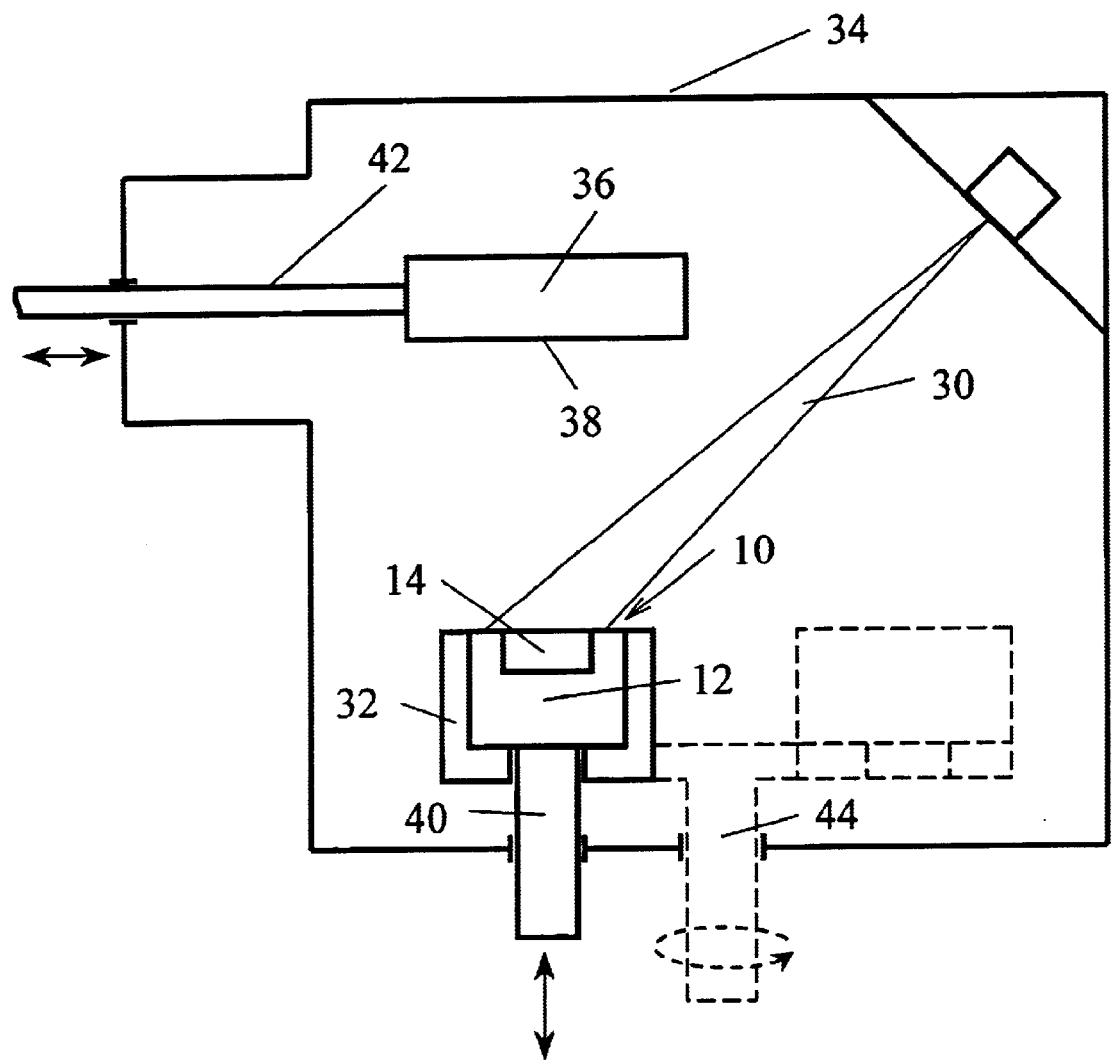
FIG. 11 is a schematic elevational view of an inventive composite ingot and substrate in a chamber.

The preferred method for coating deposition using the inventive composite ingot, shown in FIG. 11, uses a concentrated energy source 30 such as an electron beam to heat and evaporate the composite ingot 10. The composite ingot 10 is placed into a copper, water-cooled crucible 32 within a vacuum chamber 34. The part 36 containing the substrate surface 38 to be coated is placed within the same chamber 34. The part 36 may be held and rotated around a shaft 42. The composite ingot 10 is heated and evaporated by the concentrated energy source 30. The heating and evaporation of the composite ingot 10 preferably proceed continuously and sequentially from the ingot upper face to a substantially complete evaporation of the ingot lower portion. The ingot evaporation surface, as a rule the liquid pool surface, is kept at a constant distance from the concentrated energy source 30, typically by moving the ingot 10 toward the energy source 30 by means of a displacement mechanism 40. For short composite ingots, approximately 10 to 20 mm in thickness, ingot displacement is not necessary. In another embodiment, at least two or several composite ingots 10 can be placed in an arrangement of the carousel type (dotted lines of FIG. 11) having a rotation axis 44 for sequential or alternate evaporation using the concentrated energy source 30. The use of multiple ingots 10 allows an even greater variation substrate coatings to be achieved. As the composite ingot of FIG. 1 is heated, insert 14 evaporates before the body material. Condensation and deposition of the vapors from insert 14 onto the substrate 38 provides the formation of a metal bond coat layer (or layers). Insert 14 typically has the shape of a small cylinder and is preferably comprised predominantly from metallic materials, for example, metals, metallic alloys and intermetallics. In one embodiment for deposition of thermal-barrier coatings, the composite ingot body 12 may comprise partially or completely of stabilized $ZrO_2$ and the material of insert 14 can comprise Al, Ni, Cr, Pt, MCrAlY, NiAl, (NiCr) Al, (NiPt) Al, PtAl, $Cr_3Si$, etc., depending on the substrate composition and desired properties of the coating.

Alternatively, for hard, erosion and wear-resistant coatings the body 12 may comprise $Al_2O_3$, TiC, $TiB_2$ or compositions based on $Al_2O_3$, TiC, $TiB_2$ and the material of insert 14 can comprise Sn, Al, Cu, Fe, Ni, Co, Cr, Y and alloys of Sn, Al, Cu, Fe, Ni, Co, Cr, Y.

Insert 16 may be used to provide an additional impact on the composition and structure of the bond coat layer or layers. Insert 16 is preferably in the form of a tablet or bar adjacent insert 14. A plurality of similarly shaped inserts similarly located in the upper part of the composite ingot (not shown) may be placed around insert 14. In heating of the composite ingot upper portion, insert (or inserts) 16, depending on its composition and location relative to the ingot surface (see FIG. 1), evaporates prior to the start of, simultaneously with or at the end of evaporation of insert 14, thus allowing a range of variation of bond coat layer composition and structure. Using insert (or inserts) 16, it is easy to add such elements as Al, Si, Fe, Ni, Co, Cr, Mn, Y, Pt, Zr, Hf, $Al_2O_3$ and $Cr_2O_3$, and metal-ceramic mixtures to the bond coat layer.

Additional layers may also be formed. For example, evaporation of insert 14 comprising MCrAlY type alloy and deposition of the vapor provides a layer of MCrAlY type alloy on the substrate. The layer of MCrAlY type alloy may be overlaid by a layer of nickel aluminide or platinum provided by evaporation and deposition of insert (or inserts) 16 of appropriate composition.

Insert (or inserts) 16 may comprise organic compounds. Initial evaporation and deposition of insert (or inserts) 16 comprising organic compounds of carbon can provide for the formation of layers containing carbide phases. For example, evaporation of anthracene $C_{14}H_{10}$ (melting point 216° C.; boiling point 351° C.) and deposition of the vapors on a target surface can be used to form a carbide-containing layer.

Insert 18 preferably has the shape of a tablet and is placed under insert 14. Insert 18 evaporates after evaporation of insert 14 (and insert 16 if present). Insert 18 is added to the composite ingot, if it is desired to form a smooth transition zone between the metal bond coat layer and the upper ceramic layers of the gradient coating. Insert 18 typically comprises ceramic materials or mixtures of metals and ceramics. For thermal-barrier coatings, insert 18 may comprise metal-oxide or oxide type materials, for example, Al—$ZrO_2$, Al—Y—Pt—$ZrO_2$, Al—Y—$Al_2O_3$—$ZrO_2$ or $Al_2O_3$—$Cr_2O_3$—$Y_2O_3$—$ZrO_2$.

Inserts 20, 22, and 24 are added to the composite ingot for variation of the composition and structures across the thickness of the coating ceramic layer that is formed during evaporation and condensation of the ceramic base of the ingot. These inserts function primarily to improve the coating layered gradient compositions and structures, and thereby the appropriate physico-chemical properties such as density, heat conductivity, hardness, etc.

Inserts 20, 22, and 24 preferably have the shape of bars (insert 20), cylinders and cones (insert 22) or tablets (insert 24).

It should be understood that the following examples are included for purposes of illustration so that the invention may be more readily understood and are in no way intended to limit the scope of the invention unless otherwise specifically indicated.

EXAMPLE 1

Figure 2A:
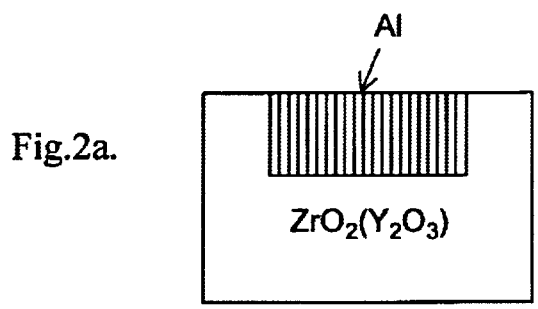
FIG. 2a is a schematic illustration of a composite ingot having a body comprising $ZrO_2(Y_2O_3)$ and an upper insert comprising Al.

As shown in FIG. 2a a composite ingot including a body comprising $ZrO_2$-7 wt. % $Y_2O_3$ and a single insert 14 was provided. The composite ingot of FIG. 2a is labeled variant 12-14. The composite ingot had a 69 mm diameter, a 37 mm thickness (upper surface to lower surface) and an approximate weight of 500 g. Insert 14 comprised a tablet of pure Al with a 25 mm diameter, 9 mm thickness (upper surface to lower surface) and weight of about 12 g. The above dimensions and weight of the ceramic body of the ingot were designed to provide an outer ceramic layer of about 150 $\mu$m thickness after coating deposition using the below described method.

The composite ingot was placed into a first, copper, water-cooled crucible with an ingot height displacement mechanism to maintain constant distance between the composite ingot surface being evaporated and the heat source. A similar second crucible was located adjacent the first crucible. A MCrAlY type alloy ingot (composition 20% Co, 20% Cr, 12% Al, 0.2% Y, the balance Ni) was disposed in the second crucible.

The substrates to be coated comprised a nickel superalloy of Rene #5 type in the form of discs of 12 mm diameter and 3 mm thickness. The disks were fastened to the surface of a sample holder having a 60 mm diameter and 100 mm length. The sample holder was connected to a horizontal shaft and drive means to rotate the sample holder at a speed of 25 rpm during coating deposition. The distance from the substrate surface to the ingot evaporation surface was 300 mm. The substrates were preheated before coating deposition to a temperature of about 1000° C. using an electron beam.

Evaporation of the MCrAlY alloy ingot and the composite ingot was performed successively and practically without interruption. Initially the MCrAlY ingot was evaporated followed by the composite ingot. The ingot evaporation was carried out using two independent electron beam guns. The power of the electron beam for the MCrAlY ingot evaporation was about 45.0 kW, and the power for the composite ingot evaporation was about 32.0 kW. The rates of condensation of the vapor evaporated from the MCrAlY and composite ingot onto the substrate surfaces were 8 $\mu$m/min and 5 $\mu$m/min respectively.

Figure 2B:
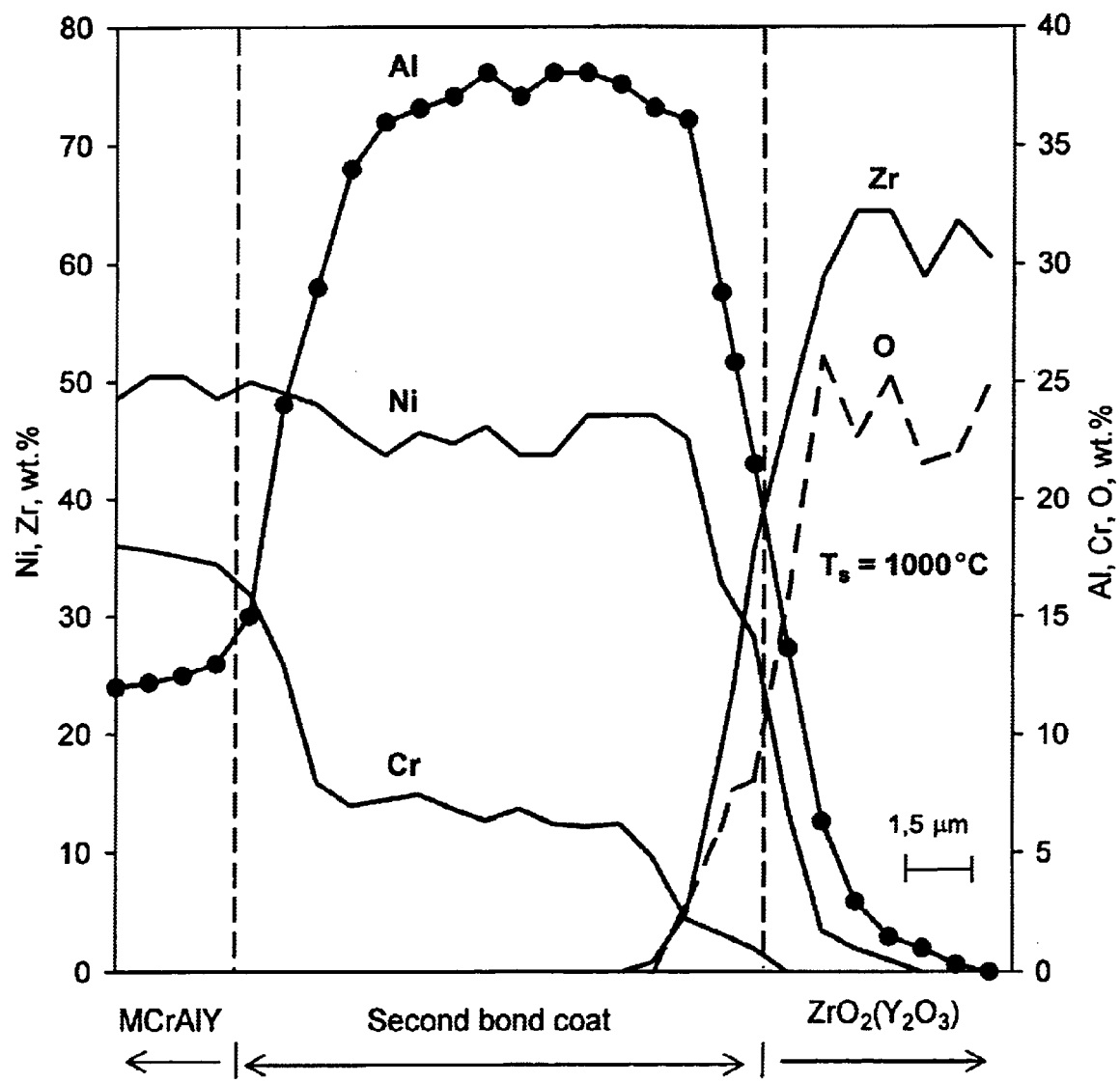

FIG. 2b is a cross-sectional distribution of selected coating elements of the deposited gradient thermal-barrier coating from the substrate surface to the coating outer $ZrO_2$ ($Y_2O_3$) layer. It should be noted that FIG. 2b shows the presence of an intermediate 12 $\mu$m thick bond coat layer comprising (Ni, Co, Cr)Al intermetallics containing 45% Ni, 14% Co (not shown in FIG. 2b) 6% Cr and 35% Al; an inner MCrAlY bond coat layer; an outer 150 $\mu$m thick $ZrO_2$ ($Y_2O_3$) ceramic layer, with smooth transitions between the layers.

The intermetallic layer formed as a result of interaction of the MCrAlY layer outer surface with the Al liquid phase deposited at the temperature of 1000° C. in the initial stage of coating deposition. By changing the weight of insert 14, it is easy to vary the thickness of the intermetallic layer within in the range of about 5 to 15 $\mu$m. As shown by additional experiments, microalloying of the intermetallic layer with Y, Zr, etc., can be accomplished by adding these elements to insert 14.

EXAMPLE 2

Figure 3A:
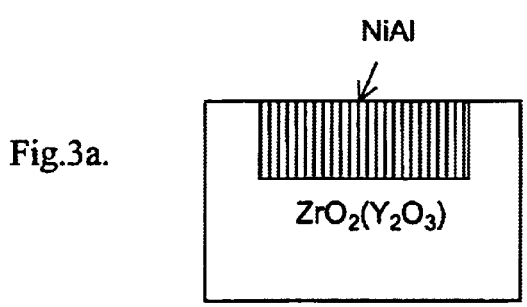
FIG. 3a is a schematic illustration of a composite ingot having a body of $ZrO_2(Y_2O_3)$ and an upper insert comprising NiAl.

As shown in FIG. 3a a composite ingot including a body comprising $ZrO_2$-7 wt. % $Y_2O_3$ and a single insert 14 was provided. The composite ingot had a 69 mm diameter, 43 mm thickness and an approximate weight of 500 g. Insert 14 comprised a tablet of NiAl intermetallics with a 64 mm diameter, 7.5 mm thickness and weight of about 100 g. Insert 14 was produced by compacting and sintering of Ni and Al powders. The insert 14 composition was 67 wt. % Ni and 33 wt. % Al. The coating deposition conditions of electron beam evaporation of the composite ingot and of vapor flow condensation onto the substrate are similar to those in EXAMPLE 1, with the exception that the composite ingot vapors were condensed and deposited directly on the substrate surfaces.

Figure 3B:
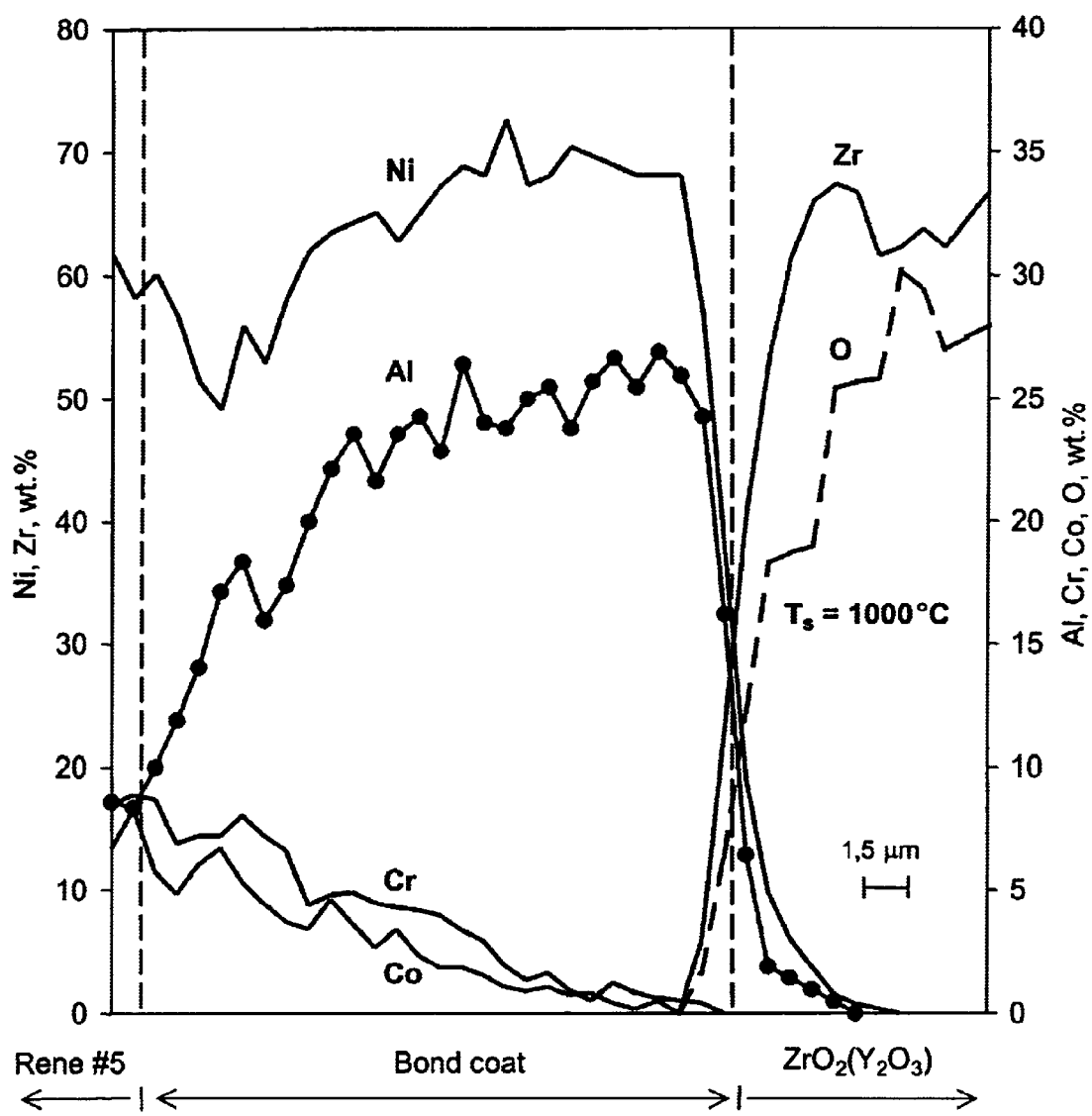

FIG. 3b is a cross-sectional distribution of selected coating elements of the deposited gradient thermal-barrier coating from the substrate to the coating outer $ZrO_2(Y_2O_3)$ layer. FIG. 3b illustrates the presence of a transition layer, approximately 5 $\mu$m thick immediately adjacent the Rene #5 substrate surface. The transition layer has an increasing content of Al and relatively low content of Ni. Next outermost is a layer of NiAl intermetallics about 18 $\mu$m thick with Cr and Co additions. These two layers function as a bond coat between the Rene #5 substrate surface and the outer $ZrO_2$ ($Y_2O_3$) layer. The thickness and composition of the intermetallic layer can be varied by changing the weight and composition of insert 14, respectively, as demonstrated by EXAMPLE 3

EXAMPLE 3

Figure 4A:
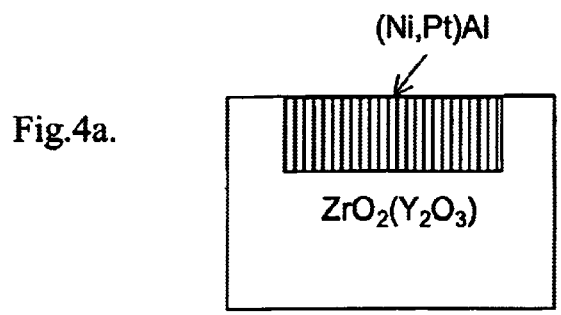
FIG. 4a is a schematic illustration of a composite ingot having a body comprising $ZrO_2(Y_2O_3)$ and an upper insert comprising (NiPt)Al.

As shown in FIG. 4a a composite ingot including a body comprising $ZrO_2$-7 wt. % $Y_2O_3$ and a single insert 14 was provided. The composite ingot had a 69 mm diameter, 37 mm thickness and approximate weight of 500 g. Insert 14 comprised a tablet of (NiPt)Al intermetallic material with a 25 mm diameter, 6 mm thickness, and weight of about 12 g. Insert 14 was produced by compacting and sintering of Ni, Pt and Al powders. The insert 14 composition was 55 wt. % Ni, 15 wt. % Pt and 30 wt. % Al. The coating deposition conditions of electron beam evaporation of the composite ingot and of vapor flow condensation onto the substrate are similar to those in EXAMPLE 1, with the exception that the composite ingot vapors were condensed and deposited directly on the substrate surfaces.

Figure 4B:
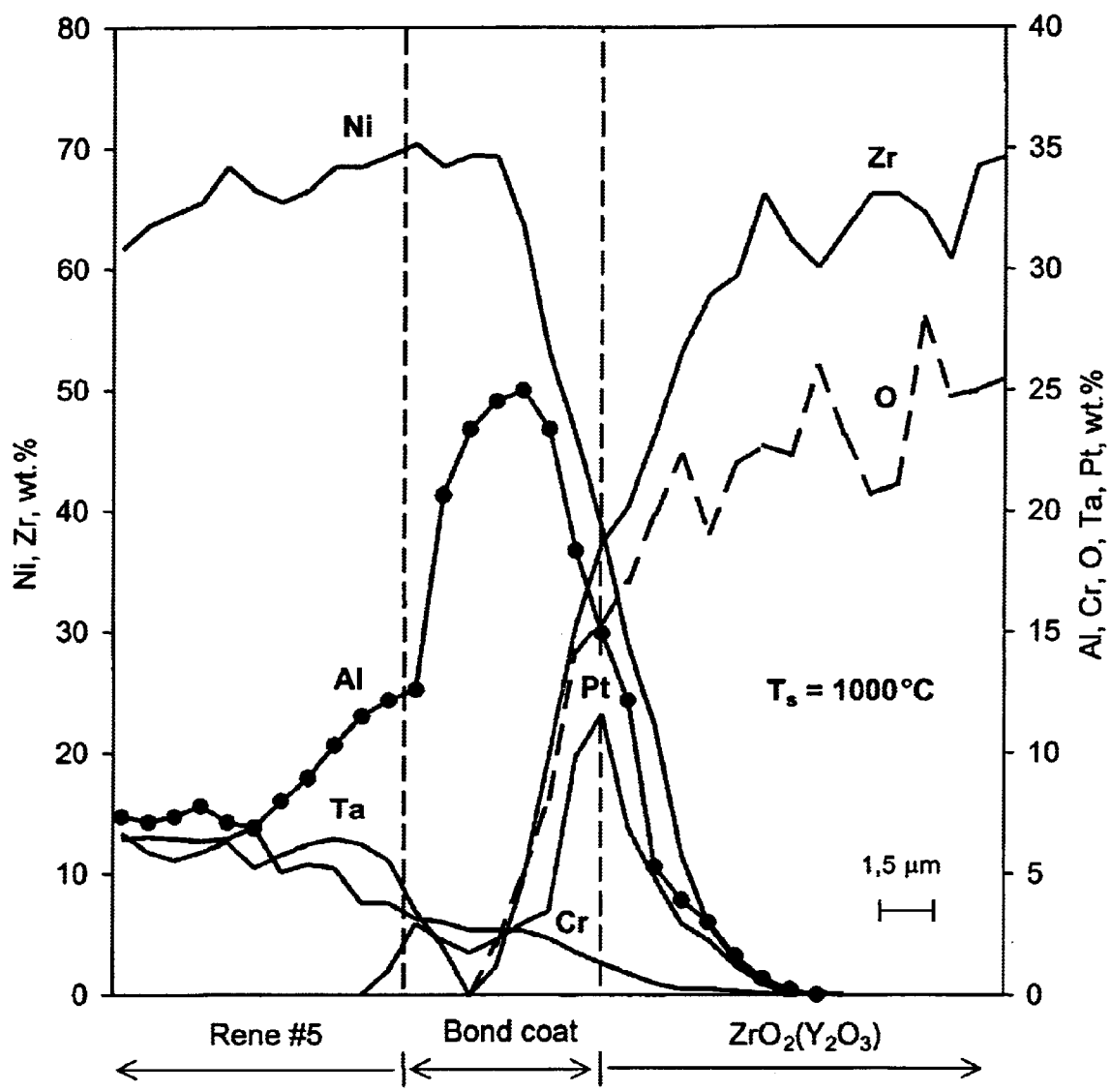

FIG. 4b is a cross-sectional distribution of selected coating elements of the deposited gradient thermal-barrier coating from the substrate surface to the coating outer $ZrO_2$ ($Y_2O_3$) layer. FIG. 4b illustrates the presence of a bond coat layer about 6 μm thick with a variable composition and an outer $ZrO_2(Y_2O_3)$ layer about 150 μm thick. The central part of the bond coat layer comprises NiAl aluminide with a minor addition of Pt. The maximal amount of Pt, about 12 wt. %, is concentrated in the transition zone between the bond coat layer and the inner portion of the outer $ZrO_2$ ($Y_2O_3$) layer.

It should be noted that a bond coat layer of (NiPt)Al with a thickness of about 30–40 μm and with a more uniform distribution of Pt, can be produced by evaporating a composite ingot including insert 14 comprising a NiAl tablet and insert 16 comprising a bar of pure Pt. This composite ingot variation (not shown) is labeled as the 12-14-16 variant.

EXAMPLE 4

Figure 5A:
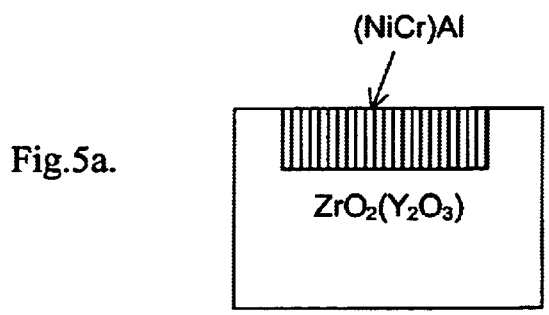
FIG. 5a is a schematic illustration of a composite ingot having a body comprising $ZrO_2(Y_2O_{3)})$ and an upper insert comprising (NiCr)Al.

As shown in FIG. 5a a composite ingot including a body comprising $ZrO_2$-7 wt. % $Y_2O_3$ and a single insert 14 was provided. The composite ingot had a 69 mm diameter, 37 mm thickness and approximate weight of 500 g. Insert 14 comprised a tablet of (NiCr)Al intermetallic material with a 64 mm diameter, 3 mm thickness and weight of about 40 g weight. Insert 14 was produced by compacting and sintering of Ni, Cr and Al powders. The insert 14 composition was 57 wt. % Ni, 15 wt. % Cr and 28 wt. % Al. The coating deposition process and parameters were similar to those described in EXAMPLE 1, wherein a MCrAlY type alloy ingot was initially evaporated and deposited on the substrate followed by evaporation and deposition of the above composite ingot, practically without pause.

Figure 5B:
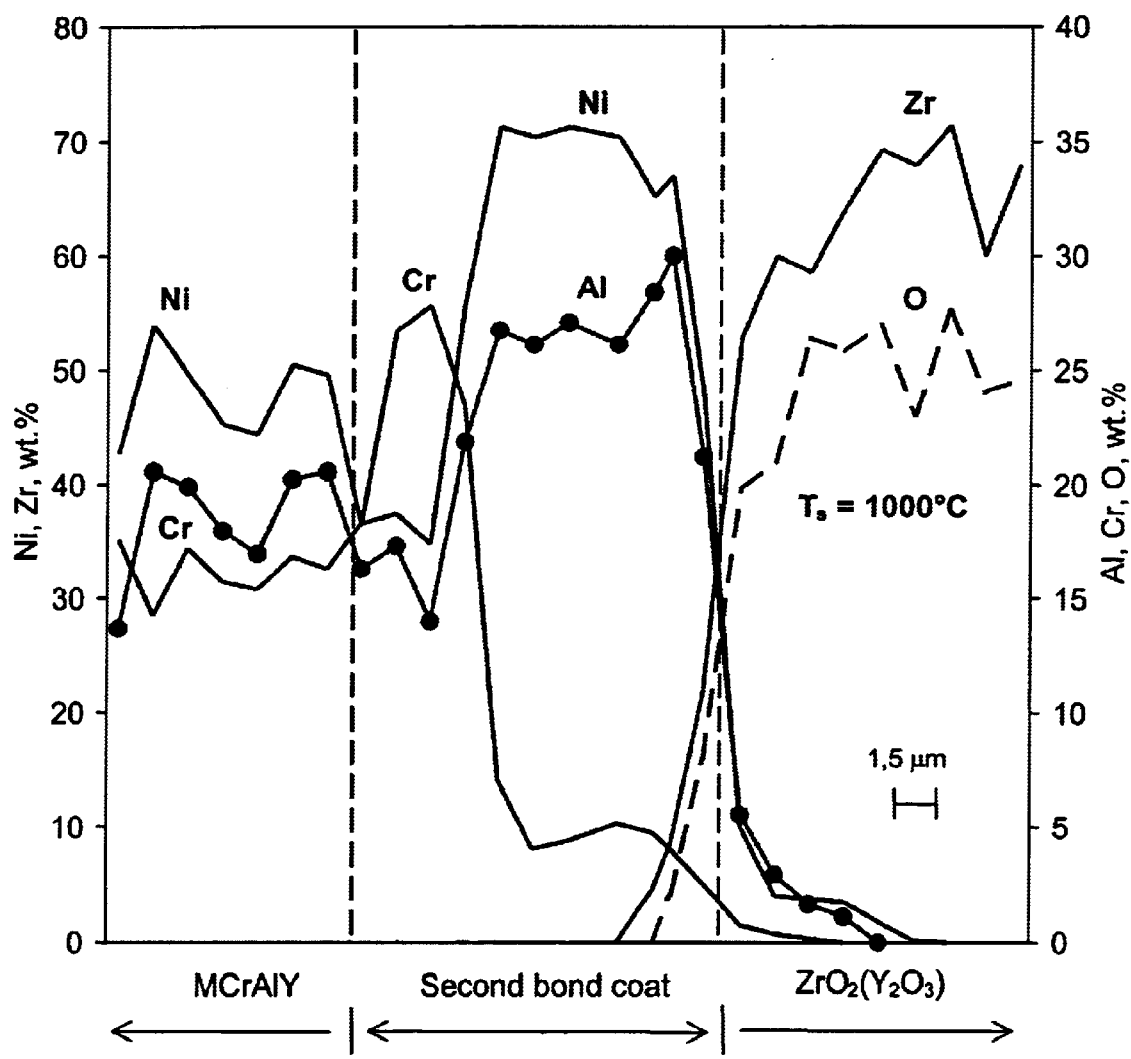

FIG. 5b is a cross-sectional distribution of selected coating elements of the deposited gradient thermal-barrier coating from the substrate surface to the coating outer $ZrO_2$ ($Y_2O_3$) layer. FIG. 5b illustrates that the second bond coat layer, formed as a result of evaporation and deposition of insert 14 (the (NiCr)Al tablet), has two concentration zones. The inner zone of about 4.0 μm thickness which is adjacent to the first bond coat layer of MCrAlY type alloy is enriched with Cr, whereas the outer second zone of about 8.0 μm thickness is comprised of NiAl aluminide with 5 wt. % Cr. The thicknesses of both the second bond coat layer and each of the inner and outer zones are proportional to the weight of (NiCr)Al insert 14. The presence of a chromium-enriched zone in the coating allows the formation of a bond coat layer (or zone) which contains chromium carbides, as will be shown in EXAMPLE 5.

EXAMPLE 5

As shown in FIG. 5a, a composite ingot including a body comprising $ZrO_2$ 7 wt. % $Y_2O_3$ and inserts 14 and 16 was provided. This composite ingot is labeled variation 12-14-16. The composite ingot had a 69 mm diameter, 37 mm thickness and weight of about 500 g. Insert 14 comprised a tablet of (NiCr)Al intermetallic materials with a 64 mm diameter, 3 mm thickness and weight of about 40 g. Insert 14 was produced by compacting and sintering of Ni, Cr and Al powders. The insert 14 composition was 57 wt. % Ni, 15 wt. % Cr and 28 wt. % Al. Insert 16 comprised a small tablet of anthracene ($Cl_4H_{10}$) of about 0.5 g weight.

The coating deposition process and parameters were similar to those described in EXAMPLE 1, without the initial deposition a MCrAlY type alloy material. Evaporation of the composite ingot of EXAMPLE 5 using continuous electron beam heating, was conducted in the following sequence:

Insert 16 (anthracene)→insert 14 (intermetallic)→composite ingot body (ceramic).

In Example 5 deposition of the vapor from the evaporated composite ingot was performed directly onto the substrate surface without deposition of an intermediary layer such as the MCrAlY type alloy layer of EXAMPLE 1. The substrate was a nickel alloy sample that contained 26 wt. % Cr and 15 wt. % W. The substrate was preheated to about 1000° C. prior to start of coating deposition. Heating of the composite ingot of EXAMPLE 5 functioned to evaporate the anthracene of insert 16. Condensation of the anthracene vapors onto the preheated substrate formed a thin layer of carbon on the preheated substrate surface. The thin layer of carbon interacted with the carbide-forming elements (W, Cr) of the substrate to form carbides of tungsten and chromium. Additionally, deposition of the material evaporated from insert 14 produced an intermetallic bond coat layer enriched in chromium as in EXAMPLE 4. The thin layer of carbon interacted with the chromium of the intermetallic bond coat layer to form chromium carbides.

Figure 6A:
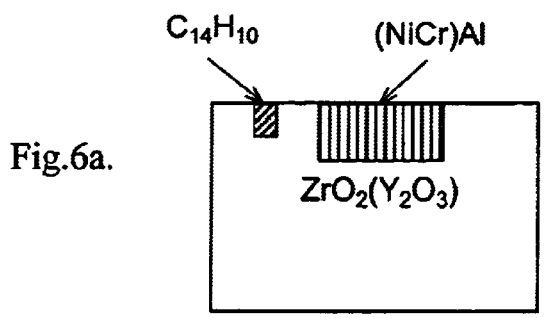
FIG. 6a is a schematic illustration of a composite ingot having a body comprising $ZrO_2(Y_2O_3)$ and upper inserts comprising $C_{14}H_{10}$ and (NiCr)Al.
Figure 6B:
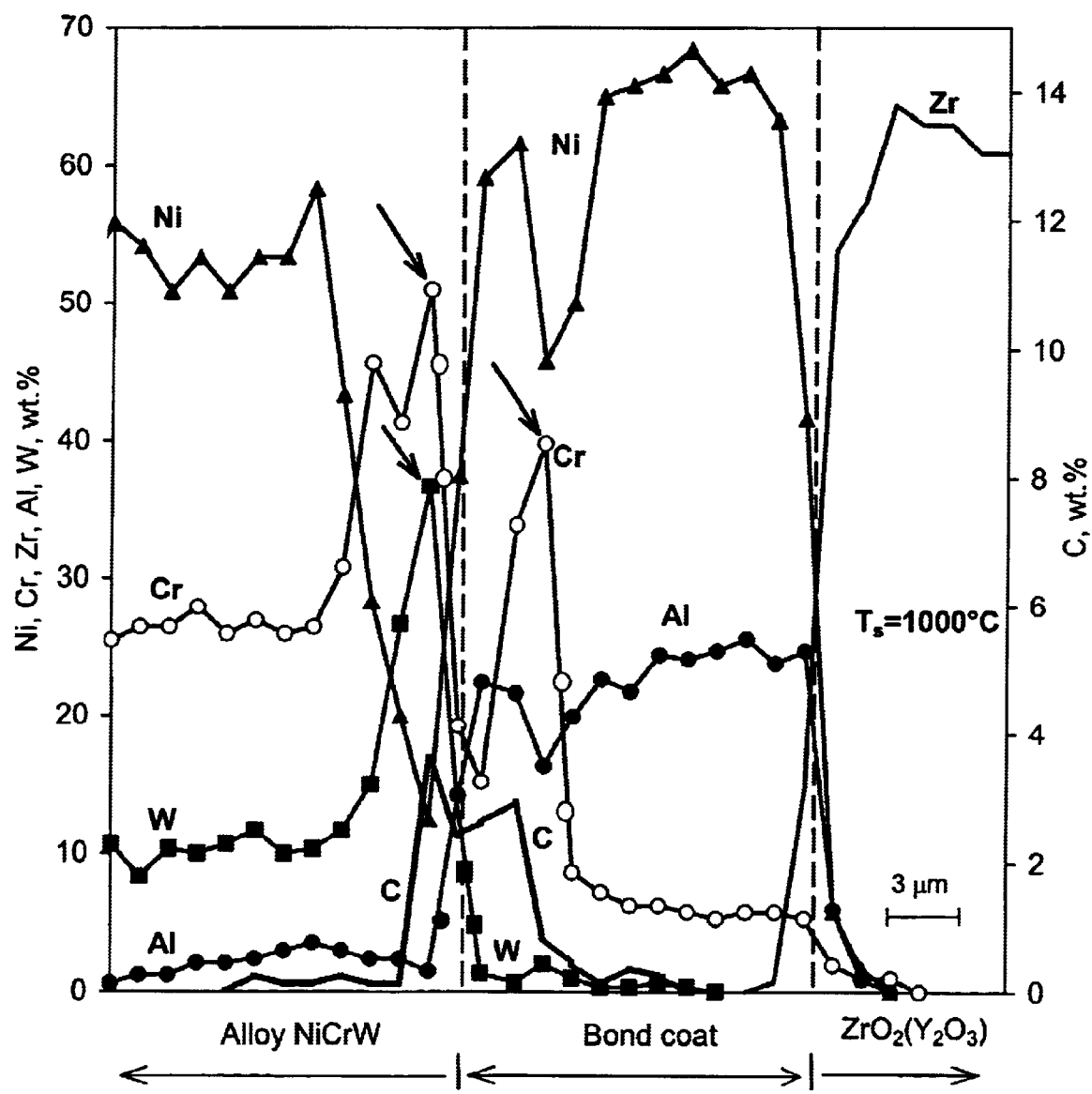

FIG. 6b is a cross-sectional distribution of selected coating elements of the deposited gradient thermal-barrier coating from the substrate to the coating outer $ZrO_2(Y_2O_3)$ layer after vacuum annealing of the coated sample at 1050° C. for two hours. The arrows in FIG. 6b indicate the presence of three concentration peaks on the W and Cr distribution curves in the substrate/coating transition zone. Further metallographic investigations confirmed that these tungsten and chromium peaks correspond to tungsten and chromium carbides that formed in the alloy matrix as a result of interaction of the carbon film with the substrate. The chromium peak in the bond coat portion of FIG. 6b corresponds to chromium carbide which formed as a result of interaction of the carbon film with the chromium-rich zone of the (NiCr)Al bond coat layer. Between the bond coat layer chromium peak and the outer ceramic layer is a layer of NiAl intermetallics about 10 μm thick, comprising 5–6 wt. % chromium. Thus, the bond coat layer in this example, approximately 15 μm thick, consists of two layers, namely the layer containing W and Cr carbides and an intermetallic layer comprising 5–6 wt. % chromium.

By increasing the weight of inserts 14 and 16 and varying the substrate preheat temperature and subsequent annealing conditions, it is possible to increase the overall thickness of the bond coat layer by several times.

EXAMPLE 6

Figure 7A:
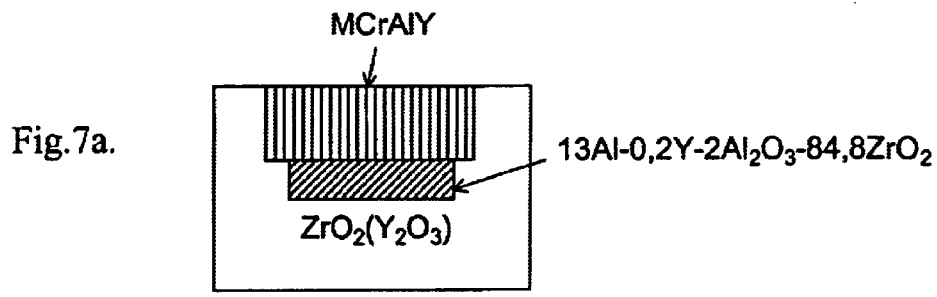
FIG. 7a is a schematic illustration of a composite ingot having a body comprised of $ZrO_2(Y_2O_3)$ and upper and middle inserts comprised of MCrAlY type alloy and 13Al—0.2Y—2$Al_2O_3$—84.8$ZrO_2$.

As shown in FIG. 7a a composite ingot including a body comprising $ZrO_2$-7 wt. % $Y_2O_3$ and inserts 14 and 18 was provided. This composite ingot variation is labeled 12-14-18. The composite ingot had a 69 mm diameter, 45 mm thickness and weight of about 500 g. Insert 14 was in the form of a small ingot of MCrAlY type alloy (comprising 20 wt. % Co; 20 wt. % Cr, 12 wt. % Al, 0.2 wt. % Y, the balance Ni) with a 64 mm diameter, 9 mm height and weight of about 120 g. Insert 18 comprised a metal-ceramic tablet of 13 wt. % Al-0.2 wt. % Y-2 wt. % $Al_2O_3$-84.8 wt. % $ZrO_2$ with a 45 mm diameter, 3 mm thickness and weight of about 16 g. The coating deposition conditions of electron beam evaporation of the composite ingot and of vapor flow condensation onto the substrate are similar to those in EXAMPLE 1, with the exception that the composite ingot vapors were condensed and deposited directly on the substrate surfaces of Rene #5 alloy samples.

Figure 7B:
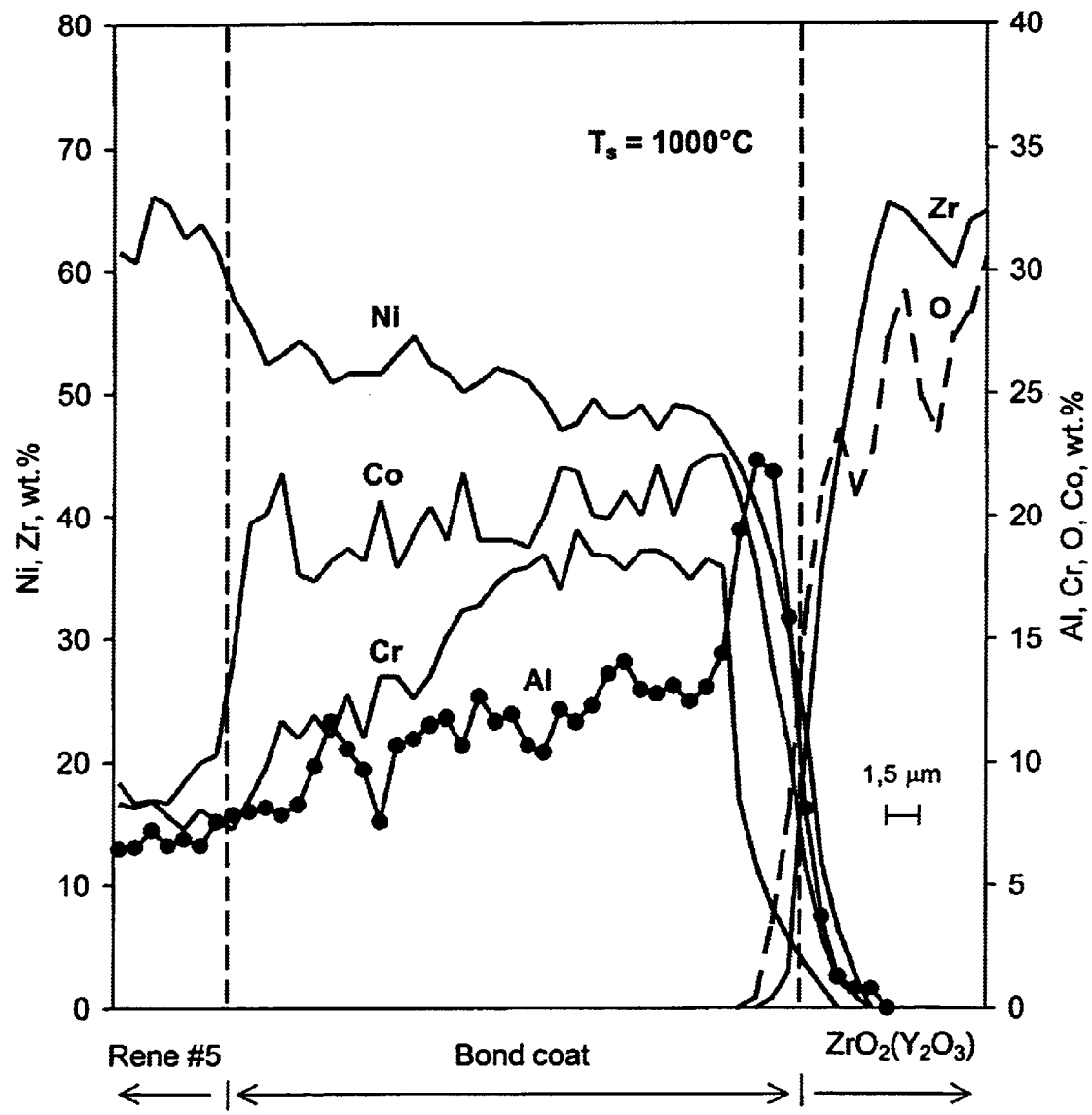

FIG. 7b is a cross-sectional distribution of selected coating elements of the deposited gradient coating from the substrate surface to the outer $ZrO_2(Y_2O_3)$ layer. FIG. 7b illustrates that the bond coat layer is comprised of a thick interlayer (about 30 µm) of MCrAlY type alloy and a thin (about 2.0 µm) interlayer of (NiCo) Al intermetallic material with approximately 5 wt. % Cr adjacent to the bond coat layer/outer $ZrO_2(Y_2O_3)$ layer interface. It is believed that $Al_2O_3$ from insert 18 is within the (NiCo) Al intermetallic interlayer in the form of dispersed particles.

By increasing the Al content of insert 18 from 13 wt. % up to about 20 wt. % it is possible to increase the thickness of the (NiCo) Al intermetallic interlayer by 1.5 to 1.6 times.

EXAMPLE 7

Figure 8A:
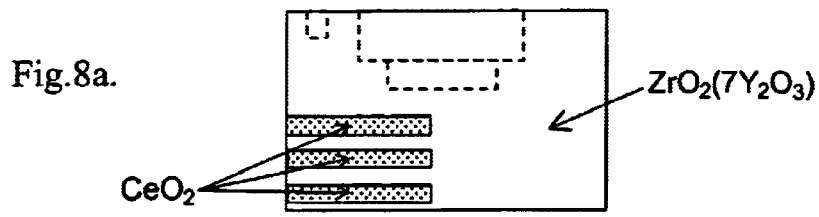
FIG. 8a is a schematic illustration of a composite ingot having a body comprising $ZrO_2(7Y_2O_3)$ and middle and lower inserts comprising $CeO_2$.

As shown in FIG. 8a a composite ingot including a body comprising $ZrO_2$-7 wt. % $Y_2O_3$ and inserts 20a, 20b and 20c was provided. The composite ingot had a 69 mm diameter, 37 mm thickness and a weight of about 500 g. Inserts 20a–20c each comprised a $CeO_2$ bar of 6 mm diameter, 40 mm length and about 5.5 g weight. Inserts 20a–20c were disposed in the central and lower parts of the ingot as shown schematically in FIG. 8a. There were no inserts disposed in the upper portion of the composite ingot. The distance from the composite ingot upper surface to insert 20a was about 12 mm. The coating deposition conditions of electron beam evaporation of the composite ingot and of vapor flow condensation onto the substrate are similar to those in EXAMPLE 1, with the exception that the composite ingot vapors were condensed and deposited directly on the substrate surfaces.

Figure 8B:
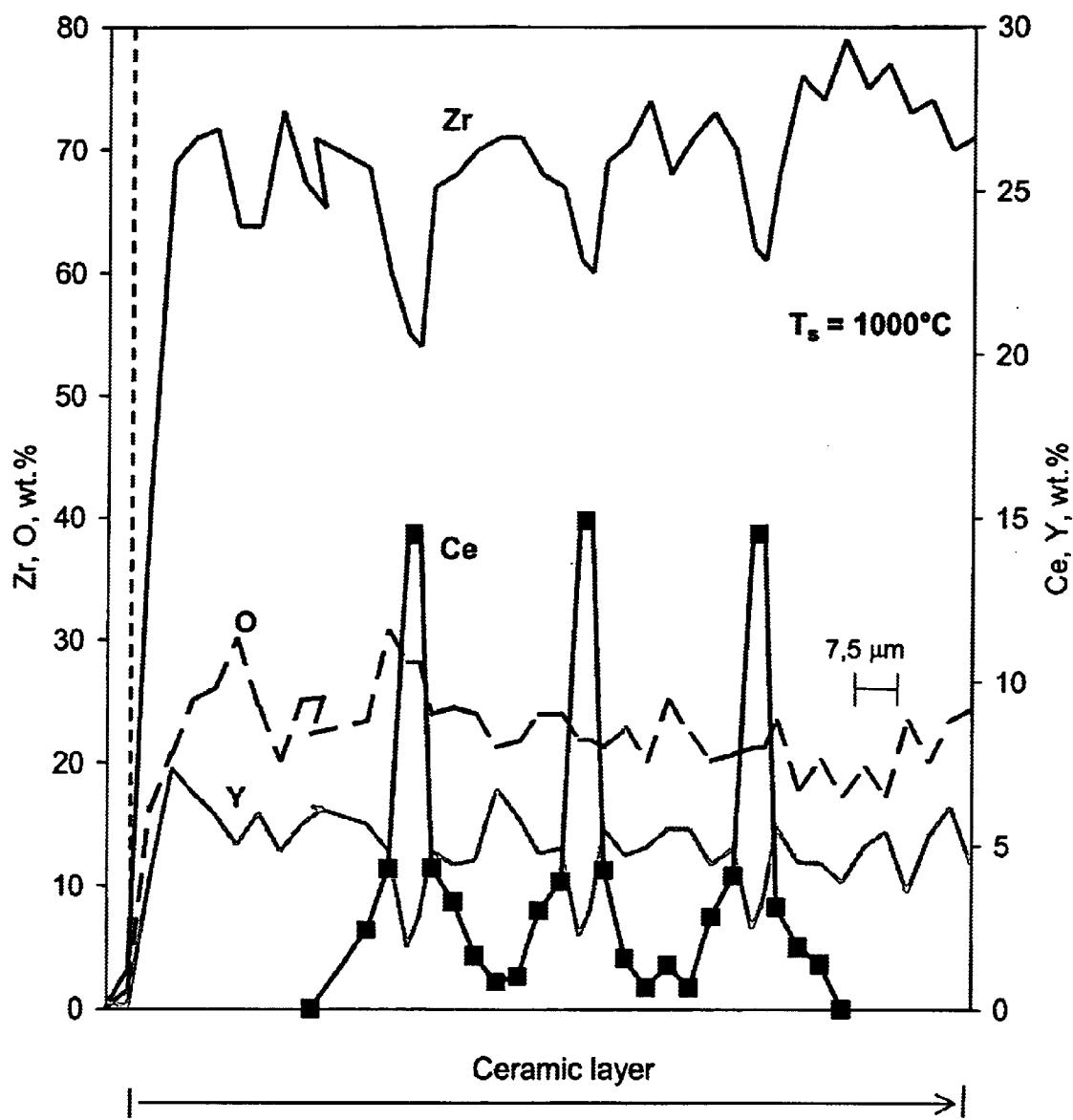

FIG. 8b is a cross-sectional distribution of selected coating elements of the ceramic layer, which is about 150 µm thick. The three microlayers, each about 5 µm thick, which contain 15 wt. % $CeO_2$ can clearly be seen. Other composite ingots incorporating inserts 20a–20c are illustrated by the following examples.

EXAMPLE 8

Figures 9A, 9B:
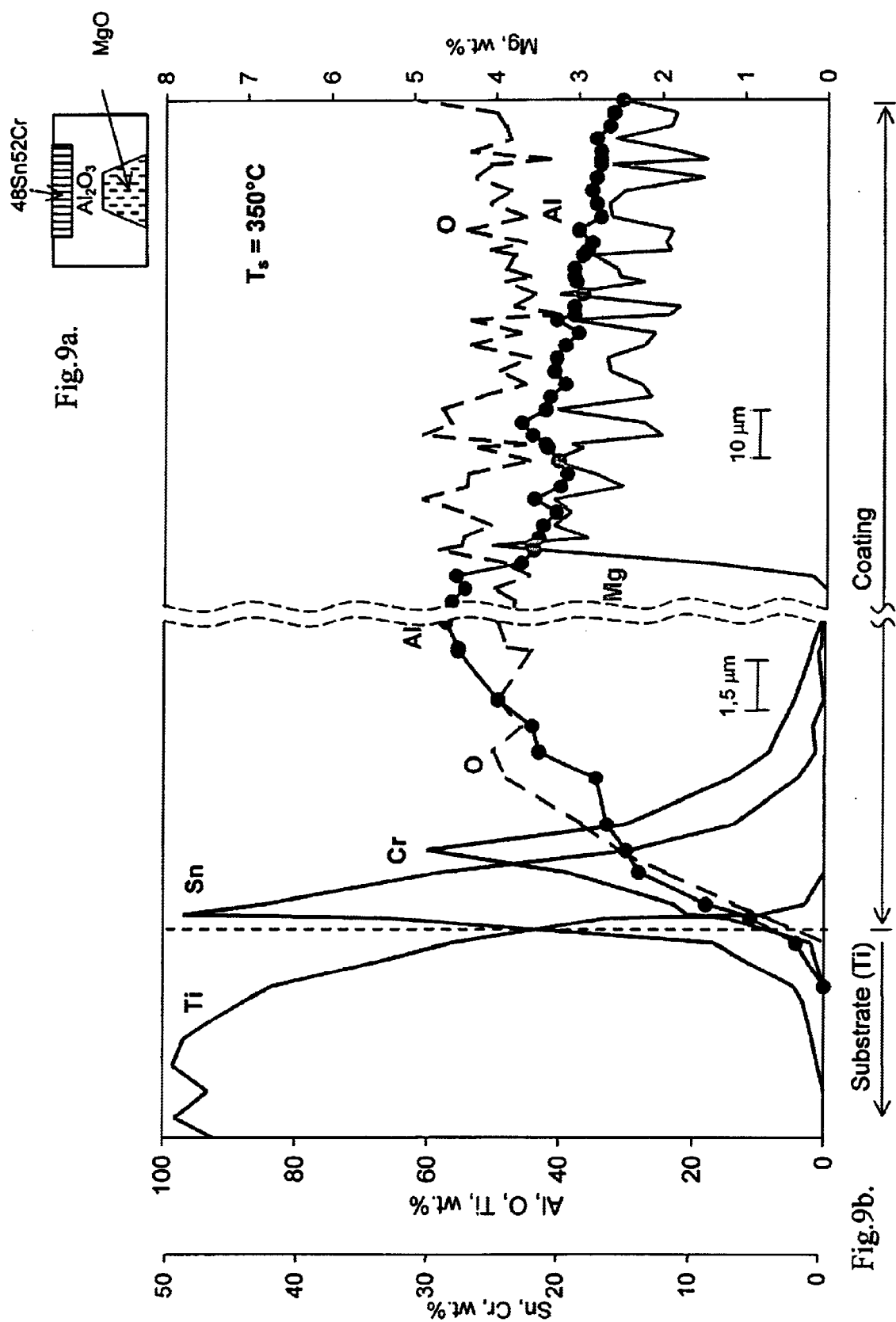

As shown in FIG. 9a a composite ;ingot including a body comprising $Al_2O_3$ and inserts 14 and 22 was provided. This composite ingot variation is labeled 12-14-22. The composite ingot had a 69 mm diameter, 18 mm thickness and weight of about 160 g. Insert 14 comprised a tablet of an alloy with 10 wt % Sn-90 wt. Al. Insert 14 had a 25 mm diameter, 4 mm thickness and weight of about 7 g. Insert 22 comprised a truncated cone shape of MgO with a 35 mm diameter base, 12 mm thickness and weight of about 30 g.

Samples of Fe, Ti and Cu, each of 35×5×2 mm size, were fastened on the flat surface of a stationary device. The distance from the sample substrate surface to the ingot evaporation surface was about 300 mm. The samples were preheated to about 350° C. using an electron beam. Evaporation of the composite ingot was also performed by an electron beam of 20 to 25 kW. The average rate of condensation of the vapor flow onto the substrate was about 3 to 4 µm/minute. The sequence of evaporation of the ingot components was as follows:

insert 14 (Sn)→insert 14 (Cr)→composite ingot body ($Al_2O_3$)→ insert 22 (MgO)

FIG. 9b is a cross-sectional distribution of selected coating elements of the deposited gradient protective $Al_2O_3$ base coating from the substrate to the coating outer layer. The coating had a total thickness of about 100 µm deposited on Ti substrate.

The coating exhibited good adhesion on all three sample substrates, namely Fe, Ti and Cu. The good adhesion is attributable, as in EXAMPLE 1, to an active interaction of the condensed liquid Sn with the substrate surface during the initial stage of coating deposition at the preheat temperature of 350° C. This interaction leads to formation of a gradient transition zone (bond coat layer) 5 to 6 µm thick between the substrate and the coating. Next outermost is a layer of $Al_2O_3$ approximately 40 µm thick (not shown in FIG. 9b) and a layer of $Al_2O_3+MgO_2$ approximately 60 µm thick.

By varying the dimensional and weight parameters of the $Al_2O_3$ body and of inserts 14 and 22, it is possible to provide a broad range of composition, structure and properties for the $Al_2O_3$ base protective coating of EXAMPLE 8.

EXAMPLE 9

Figures 10A, 10B:
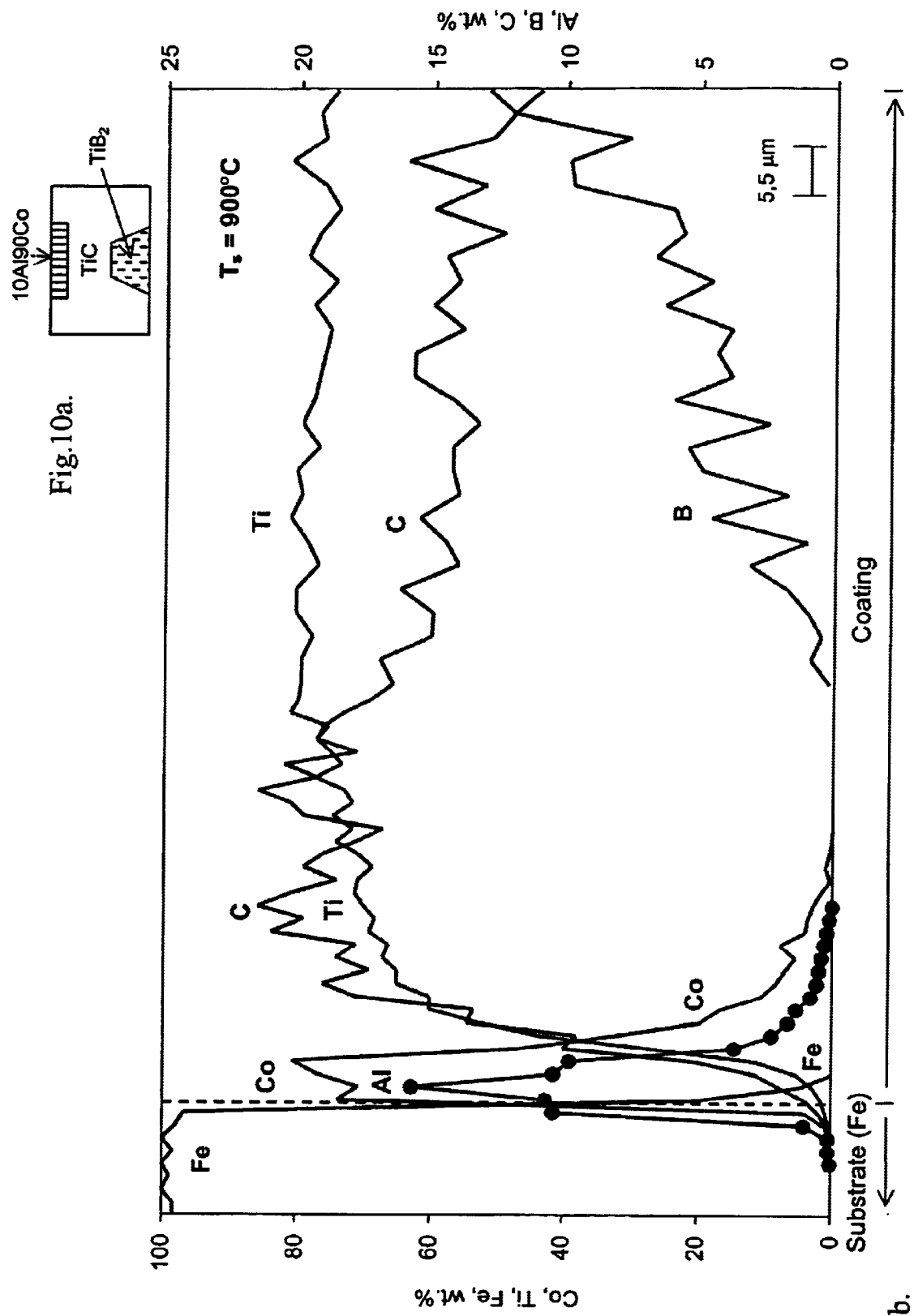

As shown in FIG. 10a a composite ingot including a body comprised of TiC. and inserts 14 and 22 was provided. This composite ingot variation was labeled 12-14-22. The composite ingot had a 69 mm diameter, 20 mm thickness and weight of about 190 g. Insert 14 was in the form of a tablet of an alloy of 10 wt % Al-90 wt % Co of 25 mm diameter, 2 mm thickness and about 7 g weight. Insert 22 was comprised of $TiB_2$ in the form of a truncated cone with 36 mm diameter of the base, 10 mm thickness and about 22 g weight. Coating deposition was performed under stationary conditions on the surface of iron samples in a manner similar to EXAMPLE 8. The samples were preheated before deposition to about 900° C. The electron beam power for evaporation of the composite ingot was about 25 kW. The average condensation rate was equal to 4–5 µm/minute.

FIG. 10b is a cross-sectional distribution of selected coating elements of the deposited gradient hard TiC. base coating from the substrate surface to the coating outer layer. The deposited coating had a total thickness of about 110 µm. The coating includes a transition zone (bond coat layer) of about 10 µm thickness, a layer of TiC. approximately 40 µm thick, and a layer of TiC+$TiB_2$ about 60 µm thick.

A similar coating cross-sectional distribution was also produced for a composite ingot including a body comprising $TiB_2$, an insert 14 comprised of an alloy of 10 wt % Al-90 wt. % Co and an insert 22 comprising TiC.

While preferred embodiments of the foregoing invention have been set forth for purposes of illustration, the foregoing description should not be deemed a limitation of the invention herein. Accordingly, various modifications, adaptations and alternatives may occur to one skilled in the art without departing from the spirit and scope of the present invention.

What is claimed is:

1. A method for producing a coating on a substrate, comprising:

providing composite ingot means for evaporating defined by first and second surfaces, the composite ingot means including at least two insert means of different chemical composition for evaporating, wherein at least two of the insert means have a different chemical composition than the composite ingot means;

heating the composite ingot means sequentially from the first surface to the second surface to evaporate the composite ingot means to form a vapor; and depositing the vapor on the substrate in a substantially uninterrupted fashion to produce the coating, wherein the coating has a chemical composition that changes as a function of position between an outermost ceramic portion and a metallic portion adjacent the substrate.

2. The method of claim 1, wherein the insert means are located between the composite ingot first and second surfaces.

3. The method of claim 1 further comprising placing the composite ingot means and the sample in a chamber and lowering the atmospheric pressure within the chamber.

4. The method of claim of 1, wherein the body is comprised of a material selected from the group consisting of zirconium oxide, aluminum oxide, titanium carbide and titanium boride.

5. A method for producing a graded coating on a substrate, comprising:

providing a composite ingot comprising a body defining first and second surfaces and at least one insert within the body, the insert having a predetermined position relative to the second surface, the body comprising a first material and the insert comprising a second material different from the first material;

evaporating the ingot sequentially at a plurality of positions from the first surface toward the second surface to form a vapor having a chemical composition, wherein the vapor chemical composition reflects the ingot position being evaporated; and depositing at least some of the vapor produced at each position onto the substrate to produce the graded coating, wherein the graded coating has a chemical composition that changes as a function of coating position between the substrate and a coating outermost ceramic portion.

6. The method of claim 5 wherein only a single composite ingot is provided and the step of depositing is accomplished in a substantially continuous operation that is generally coextensive with the step of evaporating the single composite ingot.

7. The method of claim 5 wherein the change in chemical gradient of the graded coating is influenced by the location of the insert within the body.

8. The method of claim 5 wherein the body is $ZrO_2$.

9. The method of claim 5, wherein the composite ingot defines a first portion adjacent the first surface, a second portion adjacent the second surface, and an intermediate portion between the first and second surfaces, and inserts are located in at least some of the first, second and intermediate portions.

10. The method of claim 5 wherein the body is ceramic.

11. The method of claim 5, wherein during the step of depositing, the vapor chemically reacts with the substrate.

12. The method of claim 5 wherein the first graded coating portion comprises a metallic element and is adjacent the substrate.

13. The method of claim 5, wherein the composite ingot comprises a plurality of inserts spatially arranged within the body.

14. The method of claim 5, including the step of condensing the vapor on the substrate.

15. The method of claim 5, wherein the steps of evaporating and depositing comprise:

evaporating the ingot at a first position to form a first vapor having a chemical composition representative of the first position;

depositing the first vapor on the substrate to produce a first graded coating portion;

subsequently evaporating the ingot at a second position to form a second vapor having a chemical composition representative of the second position; and depositing the second vapor on the first graded coating portion to produce an outermost ceramic portion.

* * * * *